US006666915B2

(12) United States Patent
Yang et al.

(10) Patent No.: US 6,666,915 B2
(45) Date of Patent: Dec. 23, 2003

(54) METHOD FOR THE PREPARATION OF AN EPITAXIAL SILICON WAFER WITH INTRINSIC GETTERING

(75) Inventors: Charles Chiun-Chieh Yang, Gilbert, AZ (US); Darrell D. Watkins, Jr., Maryland Heights, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 10/394,927

(22) Filed: Mar. 19, 2003

(65) Prior Publication Data

US 2003/0159650 A1 Aug. 28, 2003

Related U.S. Application Data

(63) Continuation of application No. 09/332,745, filed on Jun. 14, 1999, now abandoned.

(51) Int. Cl.[7] ............................................. C03B 23/00
(52) U.S. Cl. ............................................. 117/3; 117/84
(58) Field of Search ................................ 117/3, 85, 89, 117/105, 201, 222

(56) References Cited

U.S. PATENT DOCUMENTS

| | | |
|---|---|---|
| 4,314,595 A | 2/1982 | Yamamoto et al. |
| 4,376,657 A | 3/1983 | Nagasawa et al. |
| 4,437,922 A | 3/1984 | Bischoff et al. |
| 4,505,759 A | 3/1985 | O'Mara |
| 4,548,654 A | 10/1985 | Tobin |
| 4,851,358 A | 7/1989 | Huber |
| 4,868,133 A | 9/1989 | Huber |
| 4,958,061 A | 9/1990 | Wakabayashi et al. |
| 5,100,502 A | 3/1992 | Murdoch et al. |
| 5,271,796 A | 12/1993 | Miyashita et al. |
| 5,327,007 A | 7/1994 | Imura et al. |
| 5,332,443 A | 7/1994 | Chew et al. |
| 5,401,669 A | 3/1995 | Falster et al. |
| 5,403,406 A | 4/1995 | Falster et al. |
| 5,445,491 A | 8/1995 | Nakagawa et al. |
| 5,445,975 A | 8/1995 | Gardner et al. |
| 5,478,408 A | 12/1995 | Mitani et al. |
| 5,487,358 A | 1/1996 | Ohta et al. |
| 5,502,010 A | 3/1996 | Nadahara et al. |
| 5,502,331 A | 3/1996 | Inoue et al. |
| 5,534,294 A | 7/1996 | Kubota et al. |
| 5,551,982 A | 9/1996 | Anderson et al. |

(List continued on next page.)

FOREIGN PATENT DOCUMENTS

| | | |
|---|---|---|
| DE | 4323964 A1 | 1/1994 |
| EP | 0 536 958 A1 | 4/1993 |
| EP | 0 716 168 A1 | 6/1996 |

(List continued on next page.)

OTHER PUBLICATIONS

Abe, T., et al. "Defect–Free Surfaces of Bulk Wafers by Combination of RTA and Crystal Growth Conditions" (publication information unknown).

(List continued on next page.)

*Primary Examiner*—William A. Powell
(74) *Attorney, Agent, or Firm*—Senniger, Powers. Leavitt & Roedel

(57) ABSTRACT

This invention is directed to a novel process for the preparation of a silicon wafer comprising a surface having an epitaxial layer deposited thereon. In one embodiment, an epitaxial layer is deposited onto a surface of a silicon wafer. The wafer is also heated to a temperature of at least about 1175° C. This heat treatment begins either during or after the epitaxial deposition. Following the heat treatment, the heated wafer is cooled for a period of time at a rate of at least about 10° C./sec while (a) the temperature of the wafer is greater than about 1000° C., and (b) the wafer is not in contact with a susceptor. In this process, the epitaxial deposition, heating, and cooling are conducted in the same reactor chamber.

41 Claims, 5 Drawing Sheets

U.S. PATENT DOCUMENTS

| | | |
|---|---|---|
| 5,561,316 A | 10/1996 | Fellner |
| 5,587,019 A | 12/1996 | Fujie |
| 5,589,224 A | 12/1996 | Tepman et al. |
| 5,593,494 A | 1/1997 | Falster |
| 5,611,855 A | 3/1997 | Wijaranakula |
| 5,674,756 A | 10/1997 | Satoh et al. |
| 5,738,751 A | 4/1998 | Camerson |
| 5,738,942 A | 4/1998 | Kubota et al. |
| 5,772,773 A | 6/1998 | Wytman |
| 5,788,763 A | 8/1998 | Hayashi et al. |
| 5,789,309 A | 8/1998 | Hellwig |
| 5,820,685 A | 10/1998 | Kurihara et al. |
| 5,848,670 A | 12/1998 | Salzman |
| 5,856,240 A | 1/1999 | Sinha et al. |
| 5,860,848 A | 1/1999 | Loncki et al. |
| 5,939,770 A | 8/1999 | Kageyama |
| 5,944,889 A | 8/1999 | Park et al. |

FOREIGN PATENT DOCUMENTS

| | | |
|---|---|---|
| EP | 0 503 816 B1 | 9/1996 |
| JP | Hei 1-242500 | 9/1989 |
| JP | Hei 2-32535 | 2/1990 |
| JP | 402243594 | 9/1990 |
| JP | 3-009078 | 2/1991 |
| JP | Hei 3-185831 | 8/1991 |
| JP | Hei 4-294540 | 10/1992 |
| JP | 5-155700 A | 2/1993 |
| JP | 7-201874 A | 8/1995 |
| JP | 7/321120 | 12/1995 |
| JP | 7/335657 | 12/1995 |
| JP | Hei 8-24796 | 1/1996 |
| JP | 8/045944 | 2/1996 |
| JP | Hei 8/045945 | 2/1996 |
| JP | 8/045947 | 2/1996 |
| JP | 11-067781 A | 3/1999 |
| JP | 11/150119 A | 6/1999 |
| WO | WO 98/38675 | 9/1998 |
| WO | WO 98/45507 | 10/1998 |
| WO | WO 99/22403 | 5/1999 |
| WO | WO 00/08677 | 2/2000 |
| WO | WO 00/13211 | 3/2000 |
| WO | WO 00/34999 | 6/2000 |

OTHER PUBLICATIONS

Abe, T., et al. "Innovated Silicon Crystal Growth and Wafering Technologies" Electrochemical Soc. Proceedings, vol. 97–3 (1997) pp. 123–133.

Chiou, H., "The Effects of Preheatings on Axial Oxygen Precipitation Uniformity in Czochralski Silicon Crystals" J. Electrochem. Soc., vol. 139, No. 6 (Jun. 1992) pp 1680–1684.

Falster, R., et al. "The Engineering of Silicon Wafer Material Properties Through Vacancy Concentration Profile Control and the Achievement of Ideal Oxygen Precipitation Behavior" Mat. Res. Soc. Symp. Proc., vol. 510 (1998) pp. 27–35.

Hara, A., et al. "Enhancement of Oxygen Precipitation in Quenched Czochralski Silicon Crystals" J. Appl. Phys., vol. 66 (1989) pp. 3958–3960.

Hawkins, G. A, et al., "Effect of Rapid Thermal Processing on Oxygen Precipitation in Silicon", Mat. Res. Soc. Symp. Proc., vol. 104, pp. 197–200, 1988.

Hawkins, G. A., et al., "The Effect of Rapid Thermal Annealing on the Precipitation of Oxygen in Silicon", J. Appl. Phys., vol. 65, No. 9, pp. 3644–3654, 1989.

Jacob, M., et al. "Influence of RTP on Vacancy Concentrations" Mat. Res. Soc. Symp. Proc., vol. 490 (1998) pp. 129–134.

Nadahara, S., et al. "Hydrogen Annealed Silicon Wafer" Solid State Phenomena, vol. 57–58 (1997) pp. 19–26.

Pagani, M., et al. "Spatial Variations on Oxygen Precipitation in Silicon After High Temperature Rapid Thermal Annealing" Appl. Physl. Lett., vol. 70, No. 12, (Mar. 1997) pp. 1572–1574.

Schmolke R., et al., "Defect Depth Profile in Si(100) p/p Epitaxial Wafers", The Electrochem Soc. Proc., vol. 98, No. 1, pp. 855–866, 1998.

Shimizu, H., et al., "Excellence of Gate Oxide Integrity in Metal–Oxide–Semiconductor Large–Scale–Integrated Circuits Based on P–/P–Thin–Film Epitaxial Silicon Wafers", Jpn. J. Appl. Phys., vol. 36, p. 2565–2570, 1997.

Shimizu, H., et al., "Effects Of Surface Defects (COPs) On Isolation Leakage And Gate Oxide Integrity In MOS Large–Scale–Integrated–Circuit Devices And Cost Effective p–/p–Epitaxial Wafers", Electrochemical Society Proceedings vol. 99–1, pp. 315–323 (from a presentation on or about May 3, 1999).

Shimura, F., "Semiconductor Silicon Crystal Technology" Academic Press, Inc., San Diego, CA (1989) pp. 360–377.

Winkler, R., et al. "Improvement of the Gate Oxide Integrity by Modifying Crystal Pulling and its Impact on Device Failures" J. Electrochem. Soc., vol. 141, No. 5 (1994) pp. 1398–1401.

Zimmerman, H., et al. "Vacancy Concentration Wafer Mapping in Silicon" J. Crystal Growth, vol. 129 (1993) pp. 582–592.

PCT/US 00/14998 International Search Report dated Dec. 21, 2000, 5 pgs.

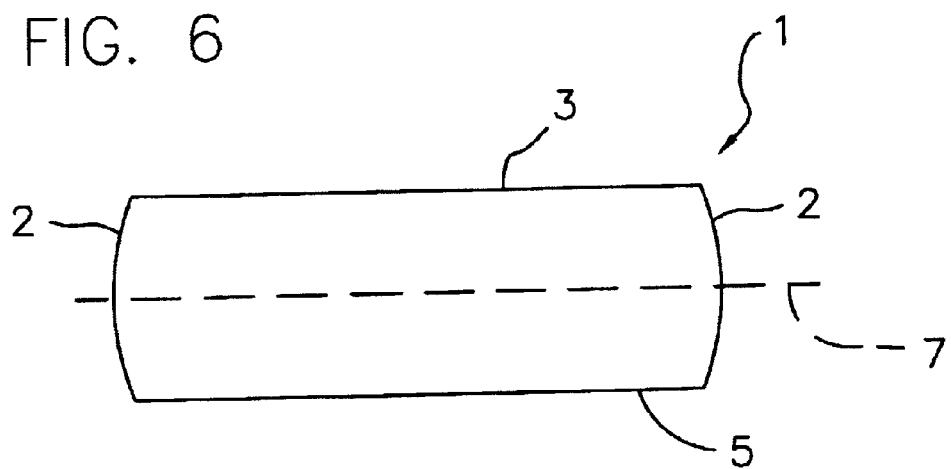
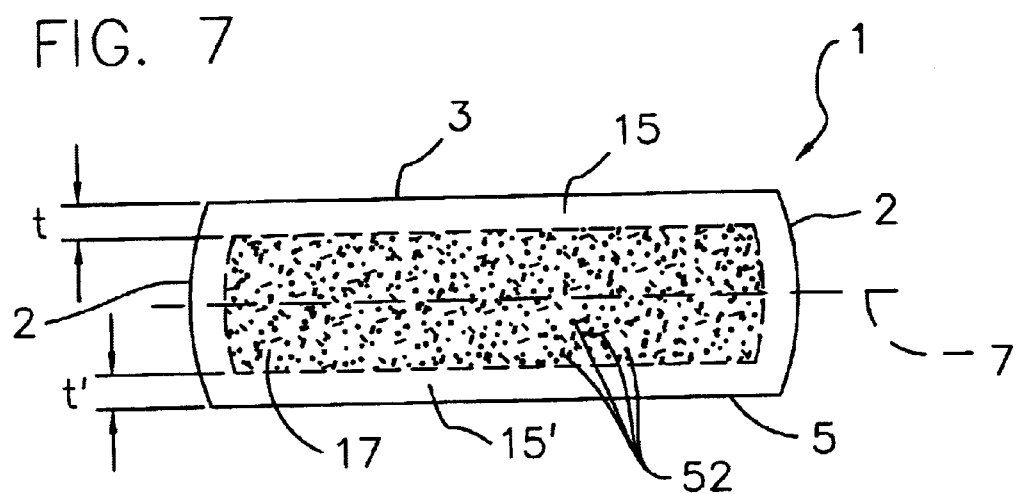
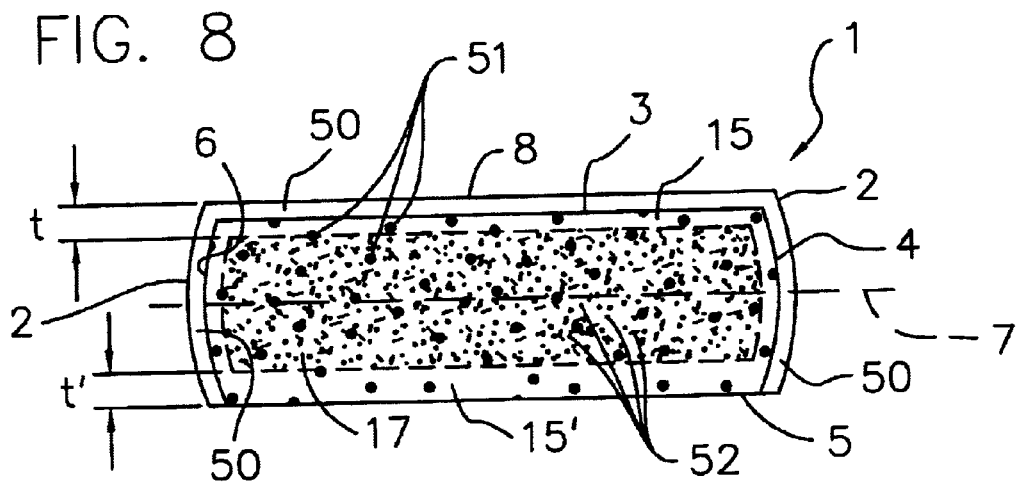

METHOD FOR THE PREPARATION OF AN EPITAXIAL SILICON WAFER WITH INTRINSIC GETTERING

REFERENCE TO RELATED APPLICATION

This application is a continuation of application Ser. No. 09/332,745, filed on Jun. 14, 1999, now abandoned.

This is a continuation patent application of prior U.S. patent application Ser. No. 09/332,745, filed Jun. 14, 1999.

FIELD OF THE INVENTION

The present invention generally relates to the preparation of semiconductor material substrates, especially silicon wafers, which are used in the manufacture of electronic components. More particularly, the present invention relates to a method for the preparation of a single crystal silicon wafer. This wafer comprises a surface having an epitaxial silicon layer deposited thereon, and forms an ideal, non-uniform depth distribution of oxygen precipitates during the heat treatment cycles of essentially any electronic device manufacturing process.

BACKGROUND OF THE INVENTION

Single crystal silicon, which is the starting material for most processes used to fabricate semiconductor electronic components, is commonly prepared by using the Czochralski ("Cz") process. In this method, polycrystalline silicon ("polysilicon") is charged to a crucible and melted, a seed crystal is brought into contact with the molten silicon, and a single crystal ingot is grown by slow extraction.

During the Cz process, defects can form in the single crystal silicon as the crystal cools after solidification. One particularly problematic type of defect is the presence of voids within the body of the ingot. The source these voids is believed to be the agglomeration of silicon lattice vacancies. Typically, the voids (or "vacancy agglomerates") have an octahedral shape and a characteristic size of at least about 0.01 $\mu$m. When the ingot is sliced into wafers, these vacancy agglomerates are exposed and appear as pits on the surfaces of the wafers. These pits (referred to as "crystal originated pits" or "COPs"), in turn, interfere with the performance of the wafer.

To date, there are three main approaches to reducing the number density of COPs. The first approach focuses on crystal pulling techniques to reduce the number density of vacancy agglomerates within the ingot. For example, it has been suggested that the number density of such vacancy agglomerates can be reduced by controlling v/$G_0$ (wherein v is the growth velocity and $G_0$ is the average axial temperature gradient) to grow a crystal in which crystal lattice vacancies (as opposed to self-interstitials) are the dominant intrinsic point defect, and then influencing the vacancy agglomerate nucleation rate by altering (generally, by slowing down) the cooling rate of the silicon ingot from 1100° C. to 1050° C. during the crystal pulling process. While such a method reduces the number density of vacancy agglomerates, it does not prevent their formation. Another crystal pulling method for reducing the number density of vacancy agglomerates involves reducing the pull rate to a value less than 0.4 mm/minute. This method, however, also is not satisfactory because such a slow pull rate leads to reduced throughput for each crystal puller. And more importantly, such a pull rate leads to the formation of single crystal silicon having a high concentration of self-interstitials. This high concentration, in turn, leads to the formation of self-interstitial agglomerates, which also are problematic.

A second approach which has been used to reduce the number density of COPs focuses on the dissolution or annihilation of the vacancy agglomerates subsequent to their formation. Generally, this is achieved by using high-temperature heat treatments of the silicon in wafer form. For example, in European Patent Application No. 503,816 A1, Fusegawa et al. propose growing the silicon ingot at a growth rate in excess of 0.8 mm/minute, and heat treating the wafers which are sliced from the ingot at a temperature in the range of 1150° C. to 1280° C. to reduce the vacancy agglomerate density in a thin region near the wafer surface. This approach is disadvantageous because it provides no uniform procedure. The specific treatment needed varies depending on the concentration and location of the vacancy agglomerates in the wafer. In fact, different wafers cut from an ingot which does not have a uniform axial concentration of such agglomerates may require different processing conditions. Further, the heat treatments of this approach are relatively costly, and have the potential for introducing metallic impurities into the wafers.

A third approach to dealing with the problem of COPs is the epitaxial deposition of a thin crystalline layer of silicon onto the surface of the wafer. This process provides a wafer having a surface which is substantially free of COPs. Use of the traditional epitaxial deposition techniques, however, substantially increases the cost of the wafer.

In addition to containing the above-discussed vacancy agglomerates, single crystal silicon prepared by the Cz method also typically contains various impurities, among which is mainly oxygen. This contamination occurs, for example, while the molten silicon is contained in the quartz crucible. At the temperature of the silicon molten mass, oxygen comes into the crystal lattice until it reaches a concentration determined by the solubility of oxygen in silicon at the temperature of the molten mass and by the actual segregation coefficient of oxygen in solidified silicon. Such concentrations are greater than the solubility of oxygen in solid silicon. Thus, as the crystal grows from the molten mass and cools, the solubility of oxygen in it decreases rapidly. This ultimately results in wafers containing oxygen in supersaturated concentrations.

When a wafer contains a supersaturated concentration of oxygen, heating the wafer (such as during a typical thermal treatment used during the fabrication of an electronic device) can cause the oxygen to precipitate within the wafer. The oxygen precipitates can be either harmful or beneficial, depending on their location. Oxygen precipitates located in the active device region of the wafer (i.e., typically near the surface) can impair the operation of the device. On the other hand, oxygen precipitates located in the bulk of the wafer tend to be beneficial because they are capable of trapping undesired metal impurities that may come into contact with the wafer. The use of oxygen precipitates located in the bulk of the wafer to trap metals is commonly referred to as internal or intrinsic gettering ("IG").

Historically, electronic device fabrication processes have included a series of steps which were designed to produce silicon having a region near the surface of the wafer which is free of oxygen precipitates (commonly referred to as a "denuded zone" or a "precipitate-free zone") with the balance of the wafer (i.e., the wafer bulk) containing a sufficient number of oxygen precipitates for IG purposes. Such oxygen precipitation profiles have been formed, for example, in a high-low-high thermal sequence such as (a) oxygen out-diffusion heat treatment at a high temperature (>1100° C.) in an inert gas for a period of at least about 4 hours, (b) oxygen precipitate nuclei formation at a low temperature (600 to 750° C.), and (c) growth of oxygen (SiO$_2$) precipitates at a high temperature (1000 to 1150° C.). See, e.g., F. Shimura, *Semiconductor Silicon Crystal Technology*, pp. 361–367 (Academic Press, Inc., San Diego Calif., 1989) (and the references cited therein).

More recently, however, advanced electronic device manufacturing processes, such as DRAM manufacturing processes, have begun to minimize the use of high-temperature process steps. Although some of these processes retain enough of the high-temperature process steps to produce a denuded zone and sufficient density of bulk precipitates, the tolerances on the material are too tight to render it a commercially viable product. Other current highly advanced electronic device manufacturing processes contain no out-diffusion steps at all. Because of the problems associated with oxygen precipitates in the active device region, therefore, these electronic device fabricators generally must use silicon wafers which are incapable of forming oxygen precipitates anywhere in the wafer under their process conditions. As a result, IG potential is lost.

SUMMARY OF THE INVENTION

The present invention provides for a process for preparing a single crystal silicon wafer which (a) has a surface that is essentially free of COPs; and (b) forms an ideal, non-uniform depth distribution of oxygen precipitates during a heat treatment cycle of essentially any electronic device manufacturing process. This process may advantageously be used with, for example, a wafer starting material which has an oxygen concentration of no greater than about 18 ppma.

Briefly, therefore, this invention is directed to a process for the preparation of a silicon wafer comprising a surface having an epitaxial layer deposited thereon. In one embodiment, an epitaxial layer is deposited onto a surface of a silicon wafer. The wafer is also heated to a temperature of at least about 1175° C. This heat treatment begins either during or after the epitaxial deposition. Following the heat treatment, the heated wafer is cooled for a period of time at a rate of at least about 10° C./sec while (a) the temperature of the wafer is greater than about 1000° C., and (b) the wafer is not in contact with a susceptor. In this process, the epitaxial deposition, heating, and cooling are conducted in the same reactor chamber.

In another embodiment, an epitaxial layer is deposited onto a wafer surface which has an average light scattering event concentration of at least about 0.5/cm$^2$, as measured by a laser-based auto inspection tool configured to detect light scattering events corresponding to polystyrene spheres having diameters of no less than about 0.12 μm. The wafer is also heated to a temperature of at least about 1175° C. This heat treatment begins either during or after the epitaxial deposition. Following the heat treatment, the wafer is cooled at a rate of at least about 10° C./sec for a period of time while the temperature of the wafer is greater than about 1000° C. In this process, the epitaxial deposition, heating, and cooling are conducted in the same reactor chamber.

In a further embodiment, an epitaxial layer having a thickness of at least about 0.1 and less than 3 μm is deposited onto a surface of a silicon wafer. The wafer is also heated to a temperature of at least about 1175° C. This heat treatment begins either during or after the epitaxial deposition. Following the heat treatment, the wafer is cooled at a rate of at least about 10° C./sec for a period of time while the temperature of the wafer is greater than about 1000° C. In this process, the epitaxial deposition, heating, and cooling are conducted in the same reactor chamber.

Other features of this invention will be in part apparent and in part pointed out hereinafter.

BRIEF DESCRIPTION OF THE DRAWINGS

FIG. 6 shows the preferred structure of a single crystal silicon wafer that may be used as the starting material in accordance with the instant invention.

FIG. 7 shows an oxygen precipitate profile of a wafer which may be prepared in accordance with a preferred embodiment of the instant invention.

FIG. 8 shows an oxygen precipitate profile of a wafer which may be prepared in accordance with a preferred embodiment of the instant invention where the starting material is a void-rich single crystal silicon wafer.

DETAILED DESCRIPTION OF THE PREFERRED EMBODIMENT

In accordance with the present invention, a novel and useful process for preparing a single crystal silicon wafer comprising a surface having an epitaxial silicon layer deposited thereon has been developed. The wafer produced by this method contains a "template" that determines (or "prints") the manner in which oxygen will precipitate within the wafer when the wafer is heated during, for example, an electronic device manufacturing process. When the wafer is subjected to such heating, the wafer will form a wafer bulk containing a sufficient density of oxygen precipitates for IG purposes, and will have a precipitate-free zone of sufficient depth to avoid interference of the electronic device performance by oxygen precipitates.

A. Reactor Configuration

The heating, epitaxial deposition, and cooling steps of this method preferably are conducted in a single reactor chamber, typically the reactor chamber of an epitaxial deposition reactor. Use of a single reactor chamber (versus two or more chambers) is advantageous for several reasons. For example, there is a savings in equipment costs because less equipment must be purchased and maintained. There also is a savings in wafer production time because no time is required for transferring the wafer from one chamber to another. Further, there is a reduced risk of contamination because the wafer surface is exposed to fewer possible contaminating environments during the process.

Figure 1:
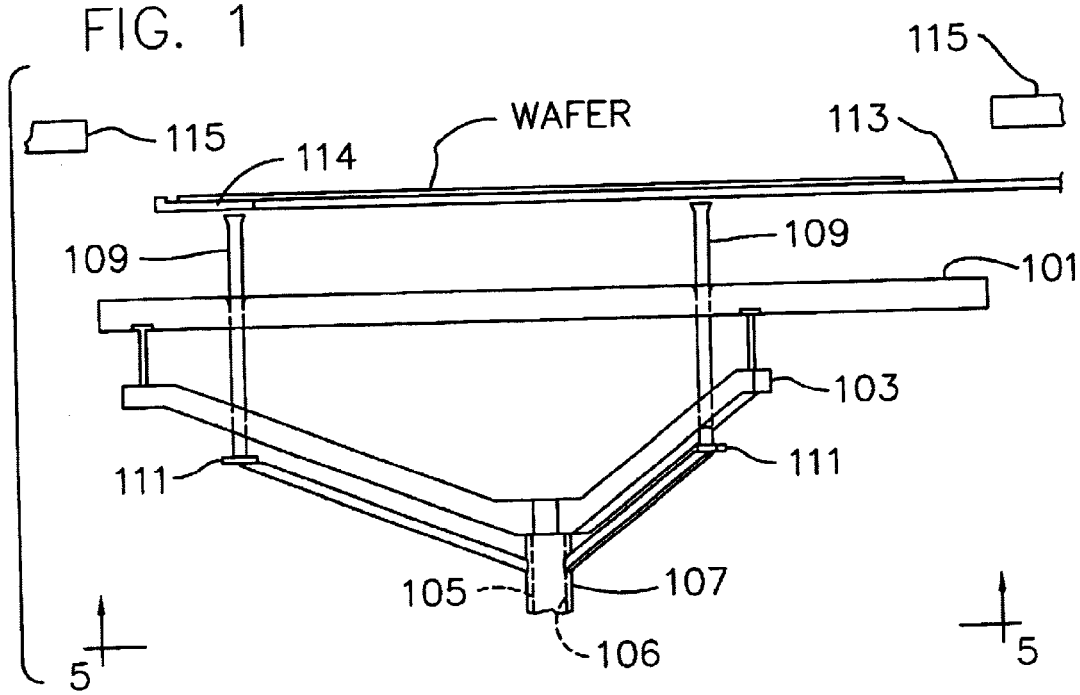
FIG. 1 is a schematic diagram of a reactor mechanism used for positioning a wafer within an epitaxial deposition reactor. In this figure, the susceptor support shaft 105 and wafer lift shaft 107 are in the exchange position.
Figure 2:
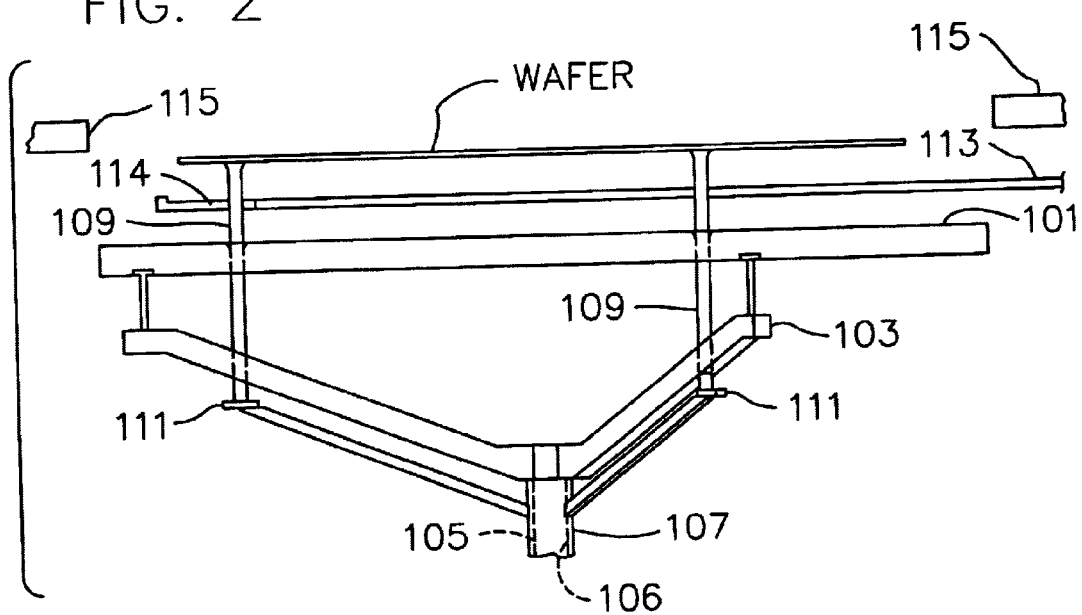
FIG. 2 is a schematic diagram of the reactor mechanism in FIG. 1. In this figure, the susceptor support shaft 105 and wafer lift shaft 107 are in the home position.
Figure 3:
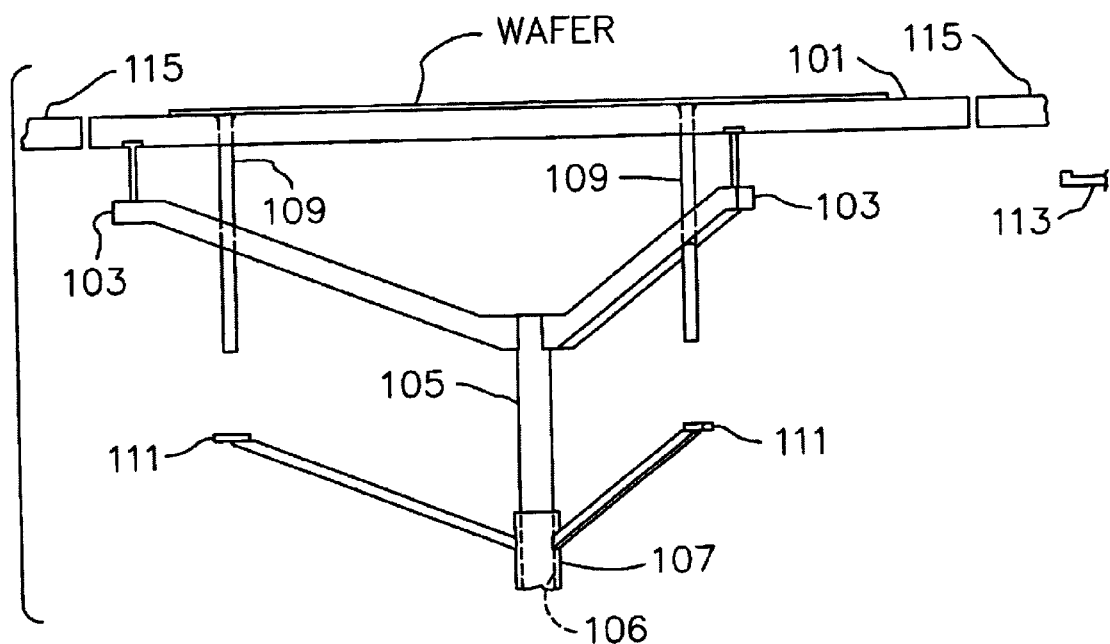
FIG. 3 is a schematic diagram of the reactor mechanism in FIG. 1. In this figure, the susceptor support shaft 105 and wafer lift shaft 107 are in the process position.
Figure 4:
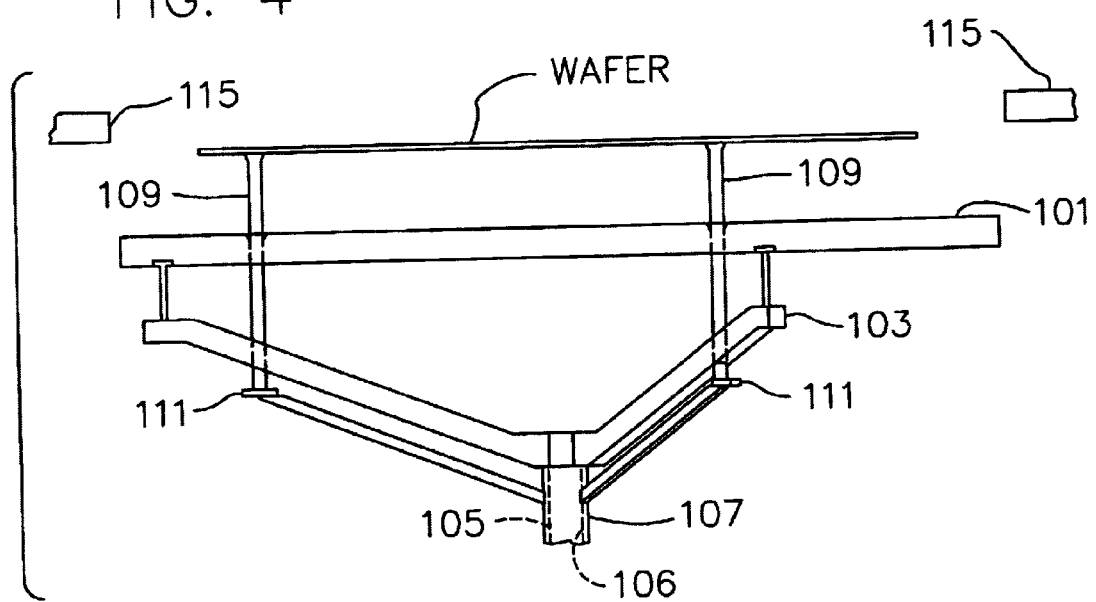
FIG. 4 is a schematic diagram of the reactor mechanism in FIG. 1. This figure shows the preferred position of the susceptor support shaft 105 and wafer lift shaft 107 when the wafer is being rapidly cooled in accordance with this invention to influence the crystal lattice vacancy profile in the wafer.
Figure 5:
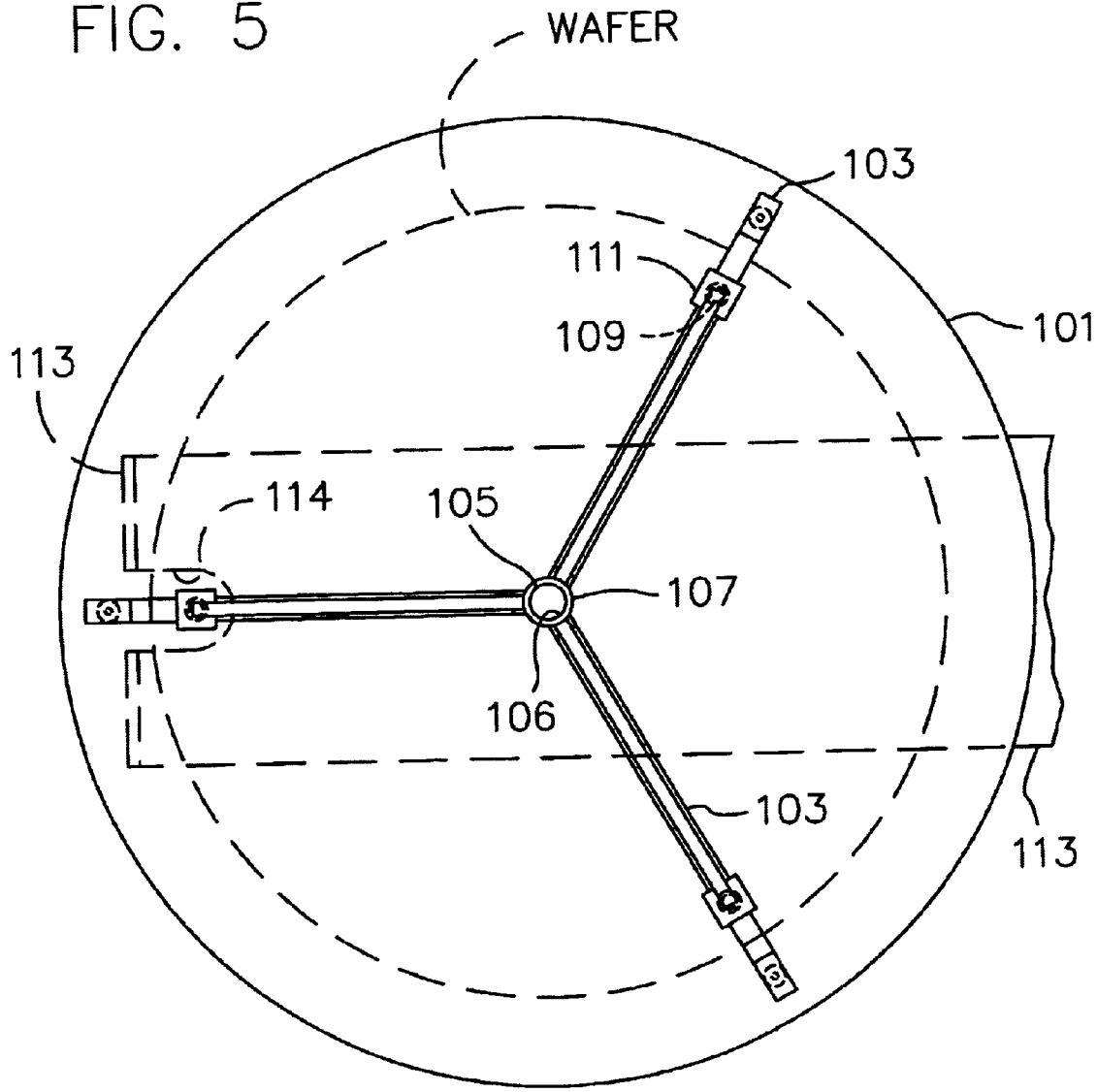
FIG. 5 is a cross-sectional view of the reactor mechanism in FIG. 1. This view is taken from line 5—5 in FIG. 1.

Applicants have found that it is particularly preferable to carry out this process using an epitaxial deposition reactor comprising the reactor mechanism shown in FIGS. 1–5 for positioning the wafer within the reactor (an example of such a reactor mechanism may be found in the EPI CENTURA® reactor manufactured by Applied Materials of Santa Clara, Calif.). This reactor mechanism includes a susceptor 101 for supporting a wafer. The susceptor 101 is fixedly mounted on arms 103 of a susceptor support shaft 105 slidingly mounted within a bore 106 of a wafer lift shaft 107. The wafer lift shaft 107 is mounted for vertical movement within a cylindrical opening in a lower dome (not shown) of the reactor. A pneumatic mechanism (not shown) is operable to move the susceptor support shaft 105 and the wafer lift shaft 107 vertically, either together or independently as desired. The pneumatic mechanism is further operable to allow the rotation of the susceptor 101. The susceptor 101 includes rigid pins 109 slidingly mounted in openings in the susceptor 101 to engage stops 111 of the wafer lift shaft 107 at their lower ends. The upper ends of the pins 109 are capable of supporting the wafer. Conventionally, the pins 109 have only been used to support the wafer during transfer to and from the reactor. To load the wafer into the reactor, the wafer is delivered to the reactor by, for example, blade 113. This blade 113 may be sized to fit between the rigid pins 109, and/or may contain one or more notches 114 through which the pins 109 fit as the blade 113 is inserted into and removed from the reactor. See FIG. 5. Once the wafer is delivered to the reactor by blade 113, the susceptor support shaft 105 and wafer lift shaft 107 are moved upward from the exchange position shown in FIG. 1 to the home position shown in FIG. 2. The upward motion of the susceptor support shaft 105 causes the pins 109 (which are engaged with the wafer lift shaft 107) to engage the back surface of the wafer and lift the wafer off the blade 113. The blade 113 is thereafter removed from the reactor. Referring to FIG. 3, the susceptor support shaft 105 is then moved further upward while the wafer lift shaft 107 remains stationary. This causes the pins 109 to slide downwardly relative to the susceptor 101 until the upper surface of the susceptor 101 is brought into contact with the wafer. Thereafter, the susceptor 101 supports the wafer. Meanwhile, the support shaft 105 continues to move upward until the susceptor 101 is coplanar with ring 115. At this point, the susceptor 101 is in the process position. To heat the wafer, a bank of high power heat lamps (not shown) in the reactor may be activated. Normally, the susceptor 101 and wafer are rotated while being heated so that the wafer is heated more uniformly.

B. Wafer Starting Material

The wafer starting material preferably is a single crystal silicon wafer which has been sliced from a single crystal ingot grown in accordance with any of the conventional variations of the Cz crystal growing method. This method, as well as standard silicon slicing, lapping, etching, and polishing techniques, are well known in the art and disclosed, for example, in F. Shimura, *Semiconductor Silicon Crystal Technology* (Academic Press, 1989); and *Silicon Chemical Etching*, (J. Grabmaier, ed., Springer-Verlag, New York, 1982).

Referring to FIG. 6, the wafer 1 preferably has a front surface 3, a back surface 5, an imaginary central plane 7 between the front and back surfaces, and a circumferential edge 2 joining the front surface 3 and the back surface 5. The terms "front" and "back" in this context are used to distinguish the two major, generally planar surfaces of the wafer 1. It should be noted that the front surface 3 is not necessarily the surface on which an electronic device will subsequently be fabricated, nor is the back surface 5 necessarily the major surface of the wafer 1 which is opposite the surface on which the electronic device is fabricated. In addition, because silicon wafers typically have some total thickness variation (TTV), warp, and bow, the midpoint between every point on the front surface and every point on the back surface may not precisely fall within a plane. As a practical matter, however, the TTV, warp, and bow are typically so slight that to a close approximation the midpoints can be said to fall within an imaginary central plane which is approximately equidistant between the front and back surfaces.

The wafer may contain one or more dopants to give the wafer various desired properties. For example, the wafer may be a P-type wafer (i.e., a wafer that has been doped with an element from Group 3 of the Periodic Table, most typically boron) or an N-type wafer (i.e., a wafer that has been doped with an element from Group 5 of the Periodic Table, most typically arsenic). Preferably, the wafer is a P-type wafer. The resistivity of the wafer preferably is from about 0.004 to about 50 $\Omega$-cm. In a particularly preferred embodiment, the wafer has a resistivity which is greater than 0.5 $\Omega$-cm, more preferably at least about 1.0 $\Omega$-cm, and even more preferably from about 1.0 to about 20 $\Omega$-cm. In another particularly preferred embodiment, the wafer has a resistivity of from about 0.01 to 1.0 $\Omega$-cm.

The wafer preferably has an oxygen concentration anywhere from about 10 to about 18 ppma (i.e., from about $5 \times 10^{17}$ to about $9 \times 10^{17}$ atoms/cm$^3$) (ASTM standard F-121-80), more preferably from about 12 to about 17 ppma (i.e., from about $6 \times 10^{17}$ to about $8.5 \times 10^{17}$ atoms/cm$^3$), even more preferably from about 12 to about 15 ppma (i.e., from about $6 \times 10^{17}$ to about $7.5 \times 10^{17}$ atoms/cm$^3$), and most preferably from about 12 to about 13 ppma (i.e., from about $6 \times 10^{17}$ to about $6.5 \times 10^{17}$ atoms/cm$^3$). An oxygen concentration that is greater than about 18 ppma is less preferred because, for example, oxygen precipitation in a wafer having such a concentration can cause the wafer to warp. Also, a greater oxygen concentration creates a greater tendency for oxygen precipitates to form near the surface of the wafer, which, in turn, can cause device failure due to leakage.

This invention is particularly useful when used with void-rich wafer starting materials. The phrase "void-rich wafers" refers to wafers that contain a relatively large number of vacancy agglomerates. As noted previously, these agglomerates typically have octahedral structures which are at least about 0.01 $\mu$m in their largest dimension. In the bulk of the wafer, these agglomerates are in the form of voids; whereas at the surface of the wafer, they appear in the form of COPs. COPs may be detected by a laser-based auto inspection tool (sometimes referred to as a "laser-based surface inspection tool" or a "wafer surface particle counter"), which detects light scattering events emitted by the COPs when the surface is scanned by the tool's laser. Examples of suitable commercially available auto inspection tools include the Surfscan 6220 from KLA Tencor (Mountain View, Calif.); and the CR80, CR81, and CR82 from ADE Optical Systems Corp. (Charlotte, N.C.). Void-rich wafer starting materials which are particularly preferable for use with this invention have an average light scattering event concentration of at least about 0.5/cm$^2$, as measured by a laser-based auto inspection tool configured to detect light scattering events corresponding to polystyrene spheres having diameters of no less than about 0.12 $\mu$m. More preferably, this average light scattering event concentration is from about 0.5 to about 10/cm$^2$, still more preferably from about 0.5 to about 3.5/cm$^2$, and most preferably from about 0.6 to about 1.6/cm². Void-rich wafers are particularly preferred starting materials because they may be sliced from silicon ingots formed by relatively low-cost processes, e.g., the traditional open-architecture Cz processes.

C. Wafer Pretreatment and Deposition of Epitaxial Layer

The single crystal silicon wafer prepared in accordance with this invention comprises a surface having an epitaxial silicon layer deposited thereon. The epitaxial layer may be deposited onto the entire wafer, or, alternatively, onto only a portion of the wafer. Referring to FIG. 6, the epitaxial layer preferably is deposited onto the front surface 3 of the wafer. In a particularly preferred embodiment, it is deposited onto the entire front surface 3 of the wafer. Whether it is preferred to have an epitaxial layer deposited onto any other portion of the wafer will depend on the intended use of the wafer. For most applications, the existence or non-existence of an epitaxial layer on any other portion of the wafer is not critical.

As noted earlier, single crystal silicon wafers sliced from ingots prepared by the Cz method often have COPs on their surfaces. A wafer used for integrated circuit fabrication, however, generally is required to have a surface which has essentially no COPs. A wafer having an essentially COP-free surface may be prepared by depositing an epitaxial silicon layer onto the surface of the wafer. Such an epitaxial layer fills in the COPs and ultimately produces a smooth wafer surface. This has been the topic of recent scientific investigations. See Schmolke et al., *The Electrochem. Soc. Proc.*, vol. PV98-1, p. 855 (1998); and Hirofumi et al., *Jpn. J. Appl. Phys.*, vol. 36, p. 2565 (1997). In the context of this invention, COPs on a wafer surface generally may be eliminated by using an epitaxial silicon layer thickness of at least about 0.1 $\mu$m. Preferably, the epitaxial layer has a thickness of from about 0.1 $\mu$m to about 10 $\mu$m, more preferably at least about 0.1 and less than 3 $\mu$m, even more preferably from about 0.25 to about 2 $\mu$m, and most preferably from about 0.65 to about 1 $\mu$m.

It should be noted that the preferred thickness of the epitaxial layer may vary if the epitaxial layer is used to impart electrical properties to the wafer surface in addition to eliminating COPs. For example, precise control of a dopant concentration profile near the wafer surface may be achieved using an epitaxial layer. Where an epitaxial layer is used for a purpose in addition to eliminating COPs, such a purpose may require an epitaxial layer thickness which is greater than the preferred thickness used to eliminate the COPs. In such an instance, the minimum thickness to achieve the additional desired effect preferably is used. Depositing a thicker layer onto the wafer is generally less commercially desirable because forming the thicker layer requires a greater deposition time and more frequent cleaning of the reaction vessel.

1. Pretreatment to Remove Silicon Oxide

If a wafer has a silicon oxide layer on its surface (e.g., a native silicon oxide layer, which typically has a thickness of from about 10 to 15 Å and forms on a silicon surface when the surface is exposed to air at room temperature), the silicon oxide layer preferably is removed from the surface before the epitaxial layer is deposited onto the surface. As used herein, the phrase "silicon oxide layer" refers to a layer of silicon atoms which are chemically bound to oxygen atoms. Typically, such a silicon oxide layer contains about 2 oxygen atoms per silicon atom.

Removal of the silicon oxide layer preferably is accomplished by heating the surface of the wafer. Preferably, the wafer surface is heated to a temperature which is at least about 1100° C., more preferably at least about 1150° C., even more preferably from about 1150° C. to about 1280° C., and most preferably from about 1150 to about 1220° C. It should be recognized that if the wafer is heated non-uniformly, a thermal gradient may develop causing internal stress sufficient to cause different planes within the wafer to shift relative to each other (i.e., slip). Lightly doped wafers (e.g., a wafer doped with boron and having a resistivity of about 1 to about 10 $\Omega$-cm) have been found to be particularly susceptible to slip. Thus, the wafer preferably is heated substantially uniformly. Applicants typically use heating rates of from about 3 to about 18° C./sec, although greater heating rates (e.g., from about 20 to about 35° C.) may be used, provided that the wafer is heated substantially uniformly.

Removal of the silicon oxide layer preferably is conducted in an environment consisting essentially of no oxidants (most preferably, the environment is oxidant-free). This environment preferably comprises a noble gas (e.g., He, Ne, or Ar), HF, $H_2$, or a combination thereof. More preferably, the environment comprises HF, $H_2$, or a combination thereof; noble gas environments are less preferred because they sometimes cause pits to form in the surface of the wafer. Most preferably, the environment consists essentially of $H_2$. It should be noted that although environments comprising $N_2$ may be used, such environments are less preferred because they tend to form nitrides on the wafer surface which interfere with subsequent epitaxial deposition.

Many traditional epitaxial deposition protocols that remove a silicon oxide layer by heating a wafer in the presence of $H_2$ require the wafer to be annealed at a high temperature (e.g., 1000 to 1250° C.) for a period of time (typically 10 to 90 seconds). Such an annealing step, however, is typically not necessary for silicon oxide removal. Heating the wafer to about 1100° C. (particularly at least about 1150° C.) in an atmosphere comprising $H_2$ is typically sufficient by itself to remove a silicon oxide layer. Thus, it is preferred to only anneal the wafer until the temperature of the wafer becomes stable and uniform at the desired silicon oxide removal temperature. In one embodiment of this invention, the wafer is annealed for less than 60 seconds (preferably no greater than about 30 seconds, more preferably no greater than about 20 seconds, even more preferably from about 5 to about 15 seconds, and most preferably from about 10 to about 15 seconds) after the silicon oxide layer is removed. In another embodiment, the wafer is annealed for less than 60 seconds (preferably no greater than about 30 seconds, more preferably no greater than about 20 seconds, even more preferably from about 5 to about 15 seconds, and most preferably from about 10 to about 15 seconds) after any portion of the wafer surface reaches about 1100° C. (more preferably, about 1150° C.).

2. Deposition of Epitaxial Layer

Once the wafer surface is free of oxides, the surface preferably is exposed to an atmosphere comprising silicon to form the epitaxial layer. In a preferred embodiment of this invention, this atmosphere comprises $SiCl_4$, $SiHCl_3$, $SiH_2Cl_2$, $SiH_3Cl$, or $SiH_4$. The atmosphere also typically contains a carrier gas (preferably $H_2$). In one embodiment, the source of silicon during the epitaxial deposition is $SiH_2Cl_2$ or $SiH_4$. If $SiH_2Cl_2$ is used, the reactor pressure during deposition preferably is from about 500 to about 760 Torr. If, on the other hand, $SiH_4$ is used, the reactor pressure preferably is about 100 Torr. Most preferably, the source of silicon during the deposition is $SiHCl_3$. This tends to be much cheaper than other sources. In addition, an epitaxial deposition using $SiHCl_3$ may be conducted at atmospheric pressure. This is advantageous because no vacuum pump is required and the reactor chamber does not have to be as robust to prevent collapse. Moreover, fewer safety hazards are presented and the chance of air leaking into the reactor chamber is lessened.

During the epitaxial deposition, the wafer surface preferably is maintained at a temperature sufficient to prevent the atmosphere comprising silicon from depositing polycrystalline silicon onto the surface (i.e., a temperature of at least about 900° C.).

In one embodiment of this invention, the wafer is heat treated at a high temperature during the epitaxial deposition to influence later oxygen precipitation behavior within the wafer (this high-temperature heat treatment is discussed below in Section D). In such an embodiment, the temperature of the surface during epitaxial deposition is preferably at least about 1175° C., more preferably greater than 1200° C., even more preferably greater than 1200° C. and no greater than about 1280° C., and most preferably from about 1220° C. to about 1250° C.

In a more preferred embodiment, the epitaxial deposition is conducted before the high-temperature heat treatment. In this embodiment, the temperature of the wafer surface during the epitaxial deposition is less than the temperature during the high-temperature heat treatment, and preferably is from about 900° C. to about 1175° C., and more preferably from about 1050° C. to about 1150° C. Depositing the epitaxial layer before the high-temperature heat treatment is more preferred because lesser temperatures during epitaxial deposition tend to cause less deposition of silicon on the interior of the reactor chamber, and, therefore, less clean up time and less risk of damage to the equipment. Regardless of whether the epitaxial deposition and high-temperature heat treatment are conducted simultaneously, it is often preferred that the wafer temperature during the silicon oxide removal be the same (or substantially the same) as during the epitaxial deposition.

The rate of growth of the epitaxial deposition preferably is from about 0.5 to about 7.0 $\mu$m/min. A rate of from about 3.5 to 4.0 $\mu$m/min. may be achieved, for example, by using an atmosphere consisting essentially of about 2.5 mole % SiHCl$_3$ and about 97.5 mole % H$_2$ at a temperature of about 1150° C. and pressure of about 1 atm.

If the intended use of the wafer requires that the epitaxial layer include a dopant, the atmosphere comprising silicon also preferably contains the dopant. For example, it is often preferable for the epitaxial layer to contain boron. Such a layer may be prepared by, for example, including B$_2$H$_6$ in the atmosphere during the deposition. The mole fraction of B$_2$H$_6$ in the atmosphere needed to obtain the desired properties (e.g., resistivity) will depend on several factors, such as the amount of boron out-diffusion from the particular substrate during the epitaxial deposition, the quantity of P-type dopants and N-type dopants that are present in the reactor and substrate as contaminants, and the reactor pressure and temperature. Applicants have successfully used an atmosphere containing about 0.03 ppm of B$_2$H$_6$ (i.e., about 0.03 mole of B$_2$H$_6$ per 1,000,000 moles of total gas) at a temperature of about 1125° C. and a pressure of about 1 atm to obtain an epitaxial layer having a resistivity of about 100-cm.

D. High-Temperature Heat Treatment Followed by Rapid Cooling to Influence the Precipitation Behavior of Oxygen in the Wafer in a Subsequent Thermal Processing Step During the process of this invention, the wafer is treated to form a template of crystal lattice vacancies within the wafer which causes an ideal, non-uniform depth distribution of oxygen precipitates to form within the wafer when the wafer is heat treated, such as during a heat treatment cycle of essentially any electronic device manufacturing process. FIG. 7 shows one such oxygen precipitate distribution which may be formed by heat treating a wafer prepared in accordance with this invention. In this particular embodiment, the wafer 1 is characterized by regions 15 and 15' ("denuded zones") which are free of oxygen precipitates. These zones extend from the front surface 3 and back surface 5 to a depth of t and t', respectively. Preferably, t and t' are each from about 10 to about 100 $\mu$m, and more preferably from about 50 to about 100 $\mu$m. Between the oxygen precipitate-free regions 15 and 15', there is a region 17 which contains a substantially uniform concentration of oxygen precipitates 52. For most applications, the oxygen precipitate 52 concentration in region 17 is at least about 5×10$^8$ precipitates/cm$^3$, and more preferably about 1×10$^9$ precipitates/cm$^3$. It should be recognized that the purpose of FIG. 7 is to help acquaint those skilled in the art with this invention by illustrating merely one embodiment of this invention. This invention is not limited to that embodiment. For example, this invention may also be used to form a wafer having only one denuded zone 15 (instead of two denuded zones 15 and 15').

To form the template of crystal lattice vacancies, the wafer generally is annealed at a high temperature in a non-oxidizing environment, and then rapidly cooled at a rate of at least about 10° C./sec. The purpose of high-temperature baking is to: (a) form self-interstitial and vacancy pairs (i.e., Frenkel defects) in the crystal lattice which are distributed uniformly throughout the wafer, and (b) dissolve unstabilized oxygen precipitate nucleation centers present in the wafer. Generally, heating to greater temperatures results in a greater number of Frenkel defects being formed. The purpose of the rapid cooling is to produce a non-uniform distribution of crystal lattice vacancies, wherein the vacancy concentration is maximum at or near the center of the wafer, and decreases in the direction of the surfaces of the wafer. This non-uniform distribution of crystal lattice vacancies is believed to be caused by the fact that a portion of vacancies near the surfaces of the wafer diffuse to the surfaces during the cool down and thereby become annihilated, resulting in lower concentrations of vacancies near the surfaces.

The non-oxidizing environment used during the high-temperature heat treatment preferably comprises H$_2$, a noble gas, or a combination thereof. More preferably, the environment consists essentially of H$_2$, a noble gas, or a combination thereof. An environment consisting essentially of H$_2$ is most preferred. Whatever the composition of the non-oxidizing environment, it typically is used to purge the silicon-containing gas from the reactor chamber when the desired thickness of the epitaxial layer on the wafer has been achieved.

Figure 9:
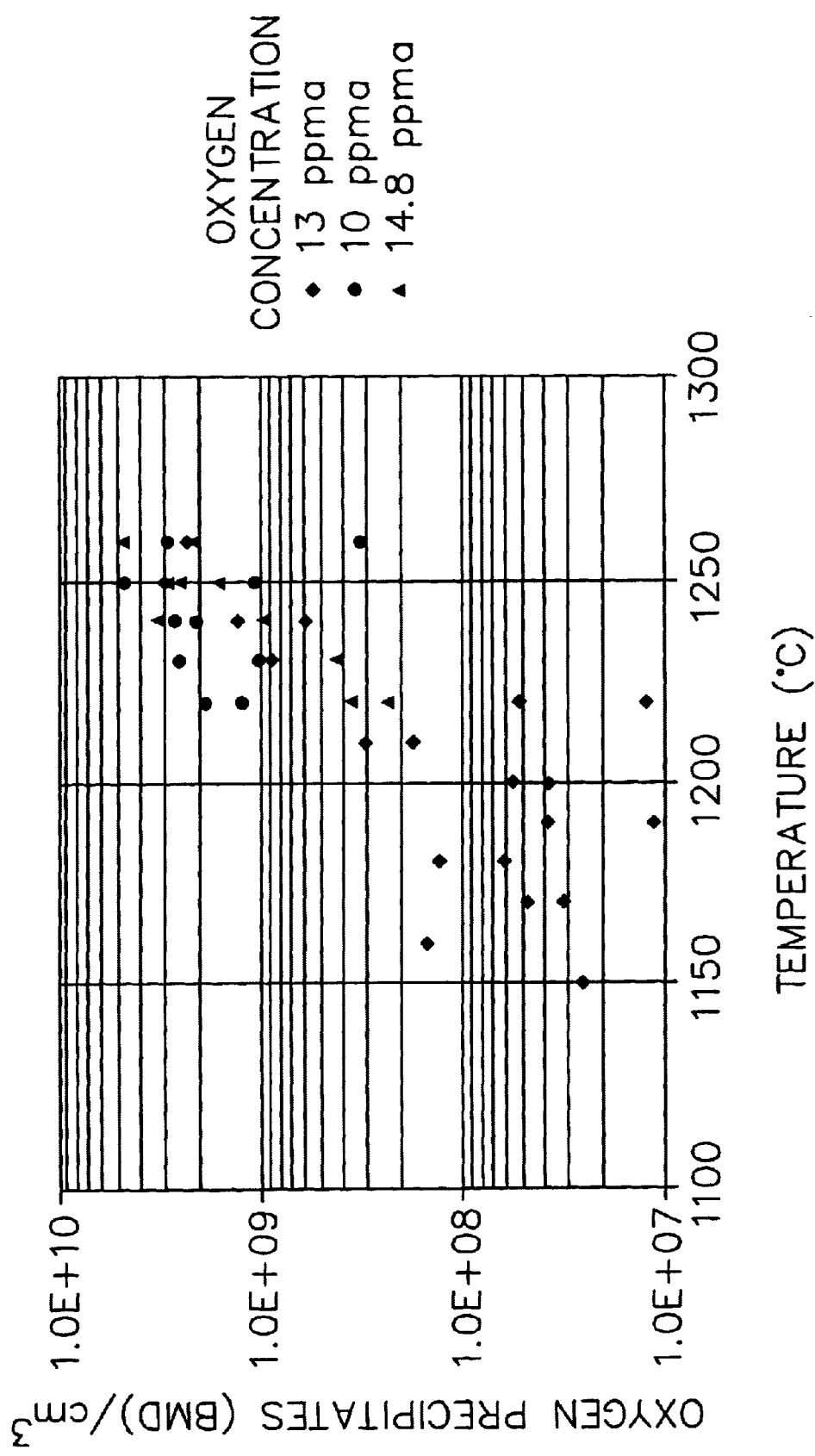
FIG. 9 shows the number density of oxygen precipitates (by measuring the density of "bulk micro defects" or "BMD's") formed as a function of (1) the temperature used during the heating step of the process of this invention, and (2) the oxygen concentration in the wafer.

The temperature used during the high-temperature heat treatment preferably is at least about 1175° C. More preferably, the temperature is greater than 1200° C., even more preferably greater than 1200° C. and not greater than about 1280° C., and most preferably from about 1220° C. to about 1250° C. Generally, a greater temperature within these ranges tends to lead to the formation of a greater number density of oxygen precipitates when a wafer prepared in accordance with this invention is subsequently heated. This tendency is shown in FIG. 9.

As noted previously, the high-temperature heat treatment may begin while the epitaxial layer is being deposited. In a more preferred embodiment, the high-temperature heat treatment begins after the epitaxial deposition ends. Even more preferably, the high-temperature treatment begins within about 5 seconds (still more preferably within about 2 seconds, and most preferably immediately) after the epitaxial deposition ends. Regardless of when the heat treatment begins, the wafer preferably is annealed at the high temperature until the later of the following: (1) at least about 5 seconds (preferably from about 5 to about 30 seconds, more preferably from about 10 to about 20 seconds, and most preferably from about 10 to about 15 seconds) after any portion of the wafer reaches the desired high temperature, or (2) when the environment surrounding the wafer is essentially free of the silicon-containing gas used for epitaxial deposition.

Following the high-temperature heat treatment, the wafer is rapidly cooled. The rapid cooling may conveniently be carried out in the same non-oxidizing atmosphere in which the heat treatment is conducted, although it may also be conducted in a different non-oxidizing atmosphere. Typically, the cooling is initiated—at least in part—by turning off the heat source in the reactor (often this heat source comprises one or more heat lamps facing the wafer). Preferably, the wafer is cooled at a rate of at least about 10° C./sec (more preferably at a rate greater than 15° C./sec, even more preferably at least about 20° C./sec, still even more preferably at least about 30° C./sec, and most preferably at least about 50° C./sec) for at least a period of time while the wafer is at a temperature at which the crystal lattice vacancies are relatively mobile. Once the wafer is cooled to the temperature at which the vacancies are no longer relatively mobile, the cooling rate does not significantly influence the precipitating characteristics of the wafer, and, thus, is not critical. Generally, crystal lattice vacancies are relatively mobile at temperatures greater than about 800° C. (particularly at temperatures greater than about 900° C., and more particularly at temperatures greater than about 1000° C.).

In an especially preferred embodiment, the average cooling rate of the wafer is at least about 10° C./sec (more preferably greater than 15° C./sec, even more preferably at least about 20° C./sec, still even more preferably at least about 30° C./sec, and most preferably at least about 50° C./sec) as the temperature of the wafer falls from the annealing temperature to a temperature which is about 150° C. (and more preferably about 250° C.) less than the annealing temperature. In another particularly preferred embodiment, the average cooling rate of the wafer is at least about 10° C./sec (more preferably greater than 15° C./sec, even more preferably at least about 20° C./sec, still even more preferably at least about 30° C./sec, and most preferably at least about 50° C./sec) until the average temperature of the wafer decreases to about 1000° C. (more preferably about 900° C., and most preferably about 800° C.).

When using a reactor having the reactor mechanism shown in FIGS. 1–5 (described above in Section A), the cooling rate preferably is increased by moving the wafer away from the susceptor 101, most preferably to a position as far as possible from the susceptor 101. This may be accomplished by, for example, lowering the susceptor support shaft 105 to the home position (see FIG. 4) or the exchange position after the heating is terminated. When the susceptor 101 is in the home or exchange position, the wafer is supported only by the pins 109, so that substantially all the back surface and all the front surface of the wafer are not in contact with any other solid hot surfaces (besides the pins 109). By lifting the wafer off of the susceptor 101, the rate of cooling of the wafer may be approximately doubled (e.g., applicants have observed the average cooling rate increasing from a range of from about 10 to 15° C./sec to a range of from about 25 to about 30° C./sec). To obtain the most preferred vacancy profile, the susceptor support shaft 105 preferably is lowered within about 3 seconds after (more preferably within about 2 seconds after, even more preferably within about 1 second after, and most preferably as soon as) the heating is terminated, i.e., when the heating source (e.g., one or more heat lamps) is turned off. Thus, if the reactor mechanism requires that the susceptor 101 be in a certain rotational position (i.e., the "rotational home position") in order for the susceptor 101 to be lowered, the susceptor 101 preferably is in that position within about 3 seconds after (more preferably within about 2 seconds after, even more preferably within about 1 second after, and most preferably at the time) the heat source is turned off.

The non-uniform vacancy profile obtained by the high-temperature heat treatment and rapid cooling is a template for oxygen precipitation. Specifically, when the wafer is subsequently heated (e.g., during an electronic device manufacturing process), oxygen will cluster rapidly to form precipitates 52 in the region 17 of the wafer 1 (see FIG. 7) containing higher concentrations of vacancies, but will tend not to cluster in the regions 15 and 15' near the wafer surfaces 3 and 5 which contain lower concentrations of vacancies. Typically, the oxygen nucleates at temperatures of from about 500° C. to about 800° C., and grows precipitates at temperatures of from about 700° C. to about 1000° C. Thus, for example, the non-uniform distribution of oxygen precipitates 52 in a wafer may be formed during a heat treatment cycle of an electronic device manufacturing process, given that such heat treatment cycles often are conducted at temperatures near 800° C.

As discussed previously, it is particularly advantageous to use this invention to treat a void-rich wafer starting material, which has a relatively large number of COPs on its surface and voids within its bulk. FIG. 8 shows an example of a crystal lattice vacancy agglomerate 51 profile and oxygen precipitate 52 profile for an epitaxial wafer, prepared from a void-rich wafer starting material using the process of the instant invention, followed by heat treatment. An epitaxial layer 50 is on the outer surfaces 3, 4, and 6 of the wafer 1 (no epitaxial layer is on the back surface 5 in this particular embodiment). Because the epitaxial layer has filled in essentially all the COPs, the wafer has smooth, essentially COP-free surface 2 and 8. The profile of the oxygen precipitates 52 is similar to the oxygen precipitate profile in FIG. 7, and is sufficient for IG purposes. The profile of the vacancy agglomerates 51 completely within the bulk (i.e., the profile of the voids within the bulk) of the wafer 1 essentially remains the same throughout the process of this invention, and does not tend to affect the surfaces 2 and 8 of the wafer 1 due to the existence of the epitaxial layer 50, which acts as a barrier between the surfaces 2 and 8 and the agglomerates 51. Thus, this invention is commercially useful, in part, because it enables the formation of a silicon wafer having intrinsic gettering ability and an essentially COP-free surface from a void-rich wafer starting material, which may be prepared with relatively low cost.

If a void-rich wafer starting material is used, the wafer produced in accordance with this invention typically may be characterized in that a surface on the wafer may be produced which has an average light scattering event concentration of at least about $0.5/cm^2$ (as measured by a laser-based auto inspection tool configured to detect light scattering events corresponding to polystyrene spheres having diameters of no less than about 0.12 $\mu$m) if the epitaxial layer and a layer of silicon extending at least 0.2 $\mu$m beneath the epitaxial layer (i.e., a layer which has a thickness of at least 0.2 μm as measured from the epitaxial layer toward the central plane of the wafer) is removed from the wafer. In a particularly preferred embodiment, this light scattering event concentration is from about 0.5 to about 1/cm$^2$, more preferably from about 0.5 to about 3.5/cm$^2$, and most preferably from about 0.6 to about 1.6/cm$^2$. The epitaxial layer and the additional layer of silicon may be removed from the front surface by various polishing and cleaning techniques which are generally known and accepted by those skilled in the art. Preferably, the polishing and cleaning technique is capable, under at least some circumstances, of polishing and cleaning a surface of a single crystal silicon wafer having a resistivity of less than about 0.02 Ω-cm to form a surface having an average light scattering event concentration of no greater than about 0.2/cm$^2$ (again, as measured by a laser-based auto inspection tool configured to detect light scattering events corresponding to polystyrene spheres having diameters of no less than about 0.12 μm).

The above description of the preferred embodiment is intended only to acquaint others skilled in the art with the invention, its principles, and its practical application, so that others skilled in the art may adapt and apply the invention in its numerous forms, as may be best suited to the requirements of a particular use. The present invention, therefore, is not limited to the above embodiments, and may be variously modified.

We claim:

1. A process for the preparation of an epitaxial silicon wafer, the epitaxial silicon wafer comprising a front surface, a back surface, a central plane between the front and back surfaces, a front surface layer which comprises a first region of the wafer between the front surface and a distance, D, measured from the front surface and toward the central plane, and a bulk layer which comprises a second region of the wafer between the central plane and front surface layer, the process comprising:

depositing an epitaxial layer onto a surface of a silicon wafer;

heating the wafer to a temperature of at least about 1175° C. during and/or after the epitaxial deposition to form crystal lattice vacancies in the front surface and bulk layers; and cooling the heated wafer for a period of time at a rate of at least about 10° C./sec while (a) the temperature of the wafer is greater than about 1000° C., and (b) the wafer is not in contact with a susceptor and controlling the cooling rate to produce a non-uniform vacancy concentration profile in the cooled wafer in which the vacancy concentration in the front surface layer being greater than the vacancy concentration in the bulk layer, and the difference in the concentration of vacancies in the front surface and bulk layers being such that a thermal treatment at a temperature in excess of 700° C. is capable of forming the front surface layer into a denuded zone and forming oxygen clusters or precipitates in the bulk layer with the concentration of the oxygen clusters or precipitates in the wafer being primarily dependent upon the concentration of vacancies, wherein D is from about 10 to about 100 micrometers, wherein the epitaxial deposition, heating, and cooling are conducted in the same reactor chamber.

2. The process of claim 1 wherein the wafer is supported by pins during said cooling.

3. The process of claim 1 wherein the susceptor is removed from contact with the wafer before about 2 seconds after said heating is terminated.

4. The process of claim 1 wherein the susceptor is removed from contact with the wafer before about 1 second after said heating is terminated.

5. The process of claim 1 wherein (a) said reactor chamber comprises a reactor mechanism which requires the susceptor to be in a rotational home position before the susceptor may be removed from contact with the wafer, and (b) the susceptor is in the rotational home position before about 2 seconds after said heating is terminated.

6. The process of claim 1 wherein (a) said reactor chamber comprises a reactor mechanism which requires the susceptor to be in a rotational home position before the susceptor may be removed from contact with the wafer, and (b) the susceptor is in the rotational home position when said heating is terminated.

7. The process of claim 1 wherein said cooling rate is at least about 20° C./sec.

8. The process of claim 1 wherein said cooling rate is at least about 30° C./sec.

9. A process for the preparation of an epitaxial silicon wafer, the epitaxial silicon wafer comprising a front surface, a back surface, a central plane between the front and back surfaces, a front surface layer which comprises a first region of the wafer between the front surface and a distance, D, measured from the front surface and toward the central plane, and a bulk layer which comprises a second region of the wafer between the central plane and front surface layer, the process comprising:

depositing an epitaxial layer onto a surface of a silicon wafer;

heating the wafer to a temperature of at least about 1175° C. during and/or after the epitaxial deposition to form crystal lattice vacancies in the front surface and bulk layers; and cooling the heated wafer at a rate of at least about 10° C./sec—for a period of time while the temperature of the wafer is greater than about and controlling the cooling rate to produce a non-uniform vacancy concentration profile in the cooled wafer in which the vacancy concentration in the front surface layer being greater than the vacancy concentration in the bulk layer, and the difference in the concentration of vacancies in the front surface and bulk layers being such that a thermal treatment at a temperature in excess of 700° C. is capable of forming the front surface layer into a denuded zone and forming oxygen clusters or precipitates in the bulk layer with the concentration of the oxygen clusters or precipitates in the wafer being primarily dependent upon the concentration of vacancies, wherein D is from about 10 to about 100 micrometers, wherein the epitaxial deposition, heating, and cooling are conducted in the same reactor chamber; and the surface of the wafer at the beginning of the epitaxial deposition has an average light scattering event concentration of at least about 0.5/cm$^2$, as measured by a laser-based auto inspection tool configured to detect light scattering events corresponding to polystyrene spheres having diameters of no less than about 0.12 μm.

10. The process of claim 9 wherein the wafer has an oxygen concentration of no greater than about 18 ppma.

11. The process of claim 9 wherein the wafer is in contact with a susceptor during at least a portion of said heating, but not during at least a portion of said cooling.

12. The process of claim 9 wherein the wafer is supported by pins during at least a portion of said cooling.

13. The process of claim 9 further comprising heating the surface of the wafer in an atmosphere consisting essentially of no oxidants to remove a silicon oxide layer from the surface before the epitaxial deposition.

14. The process of claim 13 wherein the epitaxial deposition begins no greater than about 30 seconds after the silicon oxide layer is removed.

15. The process of claim 13 wherein the epitaxial deposition begins from about 5 to about 15 seconds after the silicon oxide layer is removed.

16. The process of claim 13 wherein the surface of the wafer is heated to at least about 1100° C. to remove the silicon oxide layer, and the epitaxial deposition begins no greater than about 30 seconds after the surface of the wafer reaches about 1100° C.

17. The process of claim 13 wherein the surface of the wafer is heated to at least about 1100° C. to remove the silicon oxide layer, and the epitaxial deposition begins from about 5 to about 15 seconds after the surface of the wafer reaches about 1100° C.

18. The process of claim 13 wherein the surface of the wafer is heated to at least about 1150° C. to remove the silicon oxide layer, and the epitaxial deposition begins no greater than about 30 seconds after the surface of the wafer reaches about 1150° C.

19. The process of claim 13 wherein the surface of the wafer is heated to at least about 1150° C. to remove the silicon oxide layer, and the epitaxial deposition begins from about 5 to about 15 seconds after the surface of the wafer reaches about 1150° C.

20. The process of claim 9 wherein said heating begins after the epitaxial deposition ends.

21. The process of claim 9 wherein said heating begins within about 2 seconds after the epitaxial deposition ends.

22. The process of claim 9 wherein the wafer has a temperature which is at least about 1175° C. during at least a portion of the epitaxial deposition.

23. The process of claim 9 wherein the wafer has a temperature which is greater than about 1200° C. during at least a portion of the epitaxial deposition.

24. The process of claim 9 wherein said cooling rate is at least about 20° C./sec.

25. The process of claim 9 wherein said cooling rate is at least about 30° C./sec.

26. The process of claim 9 wherein the wafer is cooled from about 1175 to about 1000° C. at an average rate of at least about 20° C./sec during said cooling.

27. The process of claim 9 wherein the wafer is cooled from about 1175 to about 1000° C. at an average rate of at least about 30° C./sec during said cooling.

28. A process for the preparation of an epitaxial silicon wafer, the epitaxial silicon wafer comprising a front surface, a back surface, a central plane between the front and back surfaces, a front surface layer which comprises a first region of the wafer between the front surface and a distance, D, measured from the front surface and toward the central plane, and a bulk layer which comprises a second region of the wafer between the central plane and front surface layer, the process comprising:

depositing an epitaxial layer having a thickness of at least about 0.1 and less than 3 $\mu$m onto a surface of a silicon wafer;

heating the wafer to a temperature of at least about 1175° C. during and/or after the epitaxial deposition to form crystal lattice vacancies in the front surface and bulk layers; and cooling the heated wafer at a rate of at least about 10° C./sec—for a period of time while the temperature of the wafer is greater than about 1000° C. and controlling the cooling rate to produce a non-uniform vacancy concentration profile in the cooled wafer in which the vacancy concentration in the front surface layer being greater than the vacancy concentration in the bulk layer, and the difference in the concentration of vacancies in the front surface and bulk layers being such that a thermal treatment at a temperature in excess of 700° C. is capable of forming the front surface layer into a denuded zone and forming oxygen clusters or precipitates in the bulk layer with the concentration of the oxygen clusters or precipitates in the wafer being primarily dependent upon the concentration of vacancies, wherein D is from about 10 to about 100 micrometers, wherein the epitaxial deposition, heating, and cooling are conducted in the same reactor chamber.

29. The process of claim 28 wherein the epitaxial layer has a thickness of from about 0.25 to about 2 $\mu$m.

30. The process of claim 28 wherein the epitaxial layer has a thickness of from about 0.65 to about 1 $\mu$m.

31. The process of claim 28 wherein the wafer is in contact with a susceptor during at least a portion of said heating, but not during at least a portion of said cooling.

32. The process of claim 28 wherein the wafer is supported by pins during at least a portion of said cooling.

33. The process of claim 28 wherein the wafer has an oxygen concentration of no greater than about 18 ppma.

34. The process of claim 28 wherein the surface of the wafer at the beginning of the epitaxial deposition has an average light scattering event concentration of at least about 0.5/cm$^2$, as measured by a laser-based auto inspection tool configured to detect light scattering events corresponding to polystyrene spheres having diameters of no less than about 0.12 $\mu$m.

35. The process of claim 28 wherein said cooling rate is at least about 20° C./sec.

36. The process of claim 28 wherein said cooling rate is at least about 30° C./sec.

37. The process of claim 28 wherein the wafer is cooled from about 1175 to about 1000° C. at an average rate of at least about 20° C./sec during said cooling.

38. The process of claim 28 wherein the wafer is cooled from 1175 about to about 1000° C. at an average rate of at least about 30° C./sec during said cooling.

39. The process of claim 1 wherein D is from about 10 to about 50 micrometers.

40. The process of claim 9 wherein D is from about 10 to about 50 micrometers.

41. The process of claim 28 wherein D is from about 10 to about 50 micrometers.

* * * * *

UNITED STATES PATENT AND TRADEMARK OFFICE
CERTIFICATE OF CORRECTION

PATENT NO. : 6,666,915 B2
DATED : December 23, 2003
INVENTOR(S) : Charles Chium-Chieh Yang et al.

It is certified that error appears in the above-identified patent and that said Letters Patent is hereby corrected as shown below:

Column 14,
Line 36, "about and" should read -- about 1000° C. and --.
Lines 50-51, there should be no return between "micrometers, wherein".

Signed and Sealed this

Twenty-fifth Day of May, 2004

JON W. DUDAS
*Acting Director of the United States Patent and Trademark Office*

UNITED STATES PATENT AND TRADEMARK OFFICE
CERTIFICATE OF CORRECTION

PATENT NO.    : 6,666,915 B2
DATED         : December 23, 2003
INVENTOR(S)   : Charles Chiun-Chieh Yang et al.

It is certified that error appears in the above-identified patent and that said Letters Patent is hereby corrected as shown below:

Column 14,
Line 36, "about and" should read -- about 1000° C. and --.
Lines 50-51, there should be no return between "micrometers, wherein".

This certificate supersedes Certificate of Correction issued May 25, 2004.

Signed and Sealed this

Tenth Day of August, 2004

JON W. DUDAS
*Acting Director of the United States Patent and Trademark Office*